US008004883B2

(12) United States Patent
Zheng et al.

(10) Patent No.: US 8,004,883 B2
(45) Date of Patent: *Aug. 23, 2011

(54) THERMALLY ASSISTED MULTI-BIT MRAM

(75) Inventors: Yuankai Zheng, Bloomington, MN (US); Dimitar V. Dimitrov, Edina, MN (US); Haiwen Xi, Prior Lake, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/782,101

(22) Filed: May 18, 2010

(65) Prior Publication Data

US 2010/0220518 A1   Sep. 2, 2010

Related U.S. Application Data

(62) Division of application No. 12/242,254, filed on Sep. 30, 2008, now Pat. No. 7,746,687.

(51) Int. Cl.
*G11C 11/02* (2006.01)

(52) U.S. Cl. .................. 365/158; 365/171; 365/189.16

(58) Field of Classification Search .................. 365/158, 365/171, 173, 163, 189.07, 189.16
See application file for complete search history.

(56) References Cited

U.S. PATENT DOCUMENTS

| | | |
|---|---|---|
| 5,461,526 A | 10/1995 | Hamakawa |
| 5,841,692 A | 11/1998 | Gallagher |
| 5,963,472 A | 10/1999 | Inada |
| 6,166,948 A | 12/2000 | Parkin |
| 6,183,859 B1 | 2/2001 | Chen |
| 6,522,573 B2 | 2/2003 | Saito |
| 6,597,618 B2 | 7/2003 | Zheng |
| 6,605,772 B2 | 8/2003 | Harman |
| 6,633,498 B1 | 10/2003 | Engel |
| 6,714,444 B2 | 3/2004 | Huai |
| 6,771,534 B2 | 8/2004 | Stipe |
| 6,781,874 B2 | 8/2004 | Hidaka |
| 6,791,865 B2 | 9/2004 | Tran |
| 6,819,586 B1 | 11/2004 | Anthony |
| 6,829,161 B2 | 12/2004 | Huai |
| 6,838,740 B2 | 1/2005 | Huai |
| 6,845,038 B1 | 1/2005 | Skukh |
| 6,847,547 B2 | 1/2005 | Albert |
| 6,888,742 B1 | 5/2005 | Nguyen |
| 6,903,400 B2 | 6/2005 | Kikuchi |
| 6,933,155 B2 | 8/2005 | Albert |
| 6,950,335 B2 | 9/2005 | Dieny |
| 6,958,927 B1 | 10/2005 | Nguyen |

(Continued)

FOREIGN PATENT DOCUMENTS

WO   WO 2008/154519   12/2008

OTHER PUBLICATIONS

Y. Zheng et al., Magnetic Random Access Memory (MRAM), J. Nano. Sci. ← Nano Tec. 7, 177-137 (2007).

(Continued)

*Primary Examiner* — Gene N. Auduong
(74) *Attorney, Agent, or Firm* — Campbell Nelson Whipps LLC

(57) ABSTRACT

Methods of writing to a multi-bit MRAM memory unit are described. The method includes to self-detected writing to a multi-bit (i.e., multilevel) thermally assisted MRAM. The self-detected writing increases a reading margin between data state levels and decreases reading margin variability due to cell resistance variation.

20 Claims, 4 Drawing Sheets

U.S. PATENT DOCUMENTS

| | | |
|---|---|---|
| 6,963,098 B2 | 11/2005 | Daughton |
| 6,967,863 B2 | 11/2005 | Huai |
| 6,980,464 B2 | 12/2005 | Fukuzumi |
| 6,980,469 B2 | 12/2005 | Kent |
| 6,985,385 B2 | 1/2006 | Nguyen |
| 6,992,359 B2 | 1/2006 | Nguyen |
| 7,006,336 B2 | 2/2006 | Coffey |
| 7,020,009 B2 | 3/2006 | Ho |
| 7,031,178 B2 | 4/2006 | Parkin |
| 7,057,921 B2 | 6/2006 | Valet |
| 7,088,609 B2 | 8/2006 | Valet |
| 7,098,494 B2 | 8/2006 | Pakala |
| 7,110,287 B2 | 9/2006 | Huai |
| 7,126,202 B2 | 10/2006 | Huai |
| 7,160,770 B2 | 1/2007 | Susaki |
| 7,161,829 B2 | 1/2007 | Huai |
| 7,170,778 B2 | 1/2007 | Kent |
| 7,180,113 B2 | 2/2007 | Braun |
| 7,180,770 B2 | 2/2007 | Perner |
| 7,187,577 B1 | 3/2007 | Wang |
| 7,190,611 B2 | 3/2007 | Nguyen |
| 7,205,564 B2 | 4/2007 | Kajiyama |
| 7,224,601 B2 | 5/2007 | Panchula |
| 7,227,773 B1 | 6/2007 | Nguyen |
| 7,230,265 B2 | 6/2007 | Kaiser |
| 7,230,845 B1 | 6/2007 | Wang |
| 7,233,039 B2 | 6/2007 | Huai |
| 7,241,631 B2 | 7/2007 | Huai |
| 7,242,045 B2 | 7/2007 | Nguyen |
| 7,242,048 B2 | 7/2007 | Huai |
| 7,245,462 B2 | 7/2007 | Huai |
| 7,252,852 B1 | 8/2007 | Parkin |
| 7,272,034 B1 | 9/2007 | Chen |
| 7,272,035 B1 | 9/2007 | Chen |
| 7,274,057 B2 | 9/2007 | Worledge |
| 7,282,755 B2 | 10/2007 | Pakala |
| 7,286,395 B2 | 10/2007 | Chen |
| 7,289,356 B2 | 10/2007 | Diao |
| 7,307,876 B2 | 12/2007 | Kent |
| 7,310,265 B2 | 12/2007 | Zheng |
| 7,339,817 B2 | 3/2008 | Nickel |
| 7,342,169 B2 | 3/2008 | Venkatasubramanian |
| 7,345,911 B2 | 3/2008 | Min |
| 7,345,912 B2 | 3/2008 | Luo |
| 7,349,243 B2 | 3/2008 | Lin |
| 7,369,427 B2 | 5/2008 | Diao |
| 7,372,116 B2 | 5/2008 | Fullerton |
| 7,379,327 B2 | 5/2008 | Chen |
| 7,411,817 B2 | 8/2008 | Nozieres |
| 7,430,135 B2 | 9/2008 | Huai |
| 7,453,720 B2 | 11/2008 | Ju |
| 7,479,193 B1 | 1/2009 | Clark |
| 7,486,545 B2 | 2/2009 | Min |
| 7,486,551 B1 | 2/2009 | Li |
| 7,486,552 B2 | 2/2009 | Apalkov |
| 7,489,541 B2 | 2/2009 | Pakala |
| 7,502,249 B1 | 3/2009 | Ding |
| 7,508,702 B2 | 3/2009 | Ho |
| 7,515,457 B2 | 4/2009 | Chen |
| 7,518,835 B2 | 4/2009 | Huai |
| 7,525,862 B1 | 4/2009 | Sun |
| 7,576,956 B2 | 8/2009 | Huai |
| 7,660,151 B2 | 2/2010 | Leuscher |
| 7,800,095 B2 | 9/2010 | An |
| 7,804,709 B2 | 9/2010 | Wang |
| 2002/0186582 A1 | 12/2002 | Sharma |
| 2004/0084702 A1 | 5/2004 | Jeong |
| 2005/0018475 A1 | 1/2005 | Tran |
| 2005/0104146 A1 | 5/2005 | Nickel |
| 2005/0150535 A1 | 7/2005 | Samavedam |
| 2005/0150537 A1 | 7/2005 | Ghoshal |
| 2005/0174821 A1 | 9/2005 | Perner |
| 2006/0215444 A1 | 9/2006 | Perner |
| 2007/0034919 A1 | 2/2007 | Wang |
| 2007/0085068 A1 | 4/2007 | Apalkov |
| 2007/0165449 A1 | 7/2007 | Zheng |
| 2007/0258281 A1 | 11/2007 | Ifo |
| 2008/0019040 A1 | 1/2008 | Zhu |
| 2008/0037179 A1 | 2/2008 | Info |
| 2008/0055792 A1 | 3/2008 | Zheng |
| 2008/0112094 A1 | 5/2008 | Kent |
| 2008/0137224 A1 | 6/2008 | Gao |
| 2008/0154519 A1 | 6/2008 | Zhou |
| 2008/0180827 A1 | 7/2008 | Zhu |
| 2008/0186758 A1 | 8/2008 | Shen |
| 2008/0225584 A1 | 9/2008 | Gao |
| 2008/0273380 A1 | 11/2008 | Diao |
| 2008/0291720 A1 | 11/2008 | Wang |
| 2008/0291721 A1 | 11/2008 | Apalkov |
| 2008/0310213 A1 | 12/2008 | Chen |
| 2008/0310219 A1 | 12/2008 | Chen |
| 2009/0010040 A1 | 1/2009 | Takase |
| 2009/0040855 A1 | 2/2009 | Luo |
| 2009/0050991 A1 | 2/2009 | Nagai |
| 2009/0073750 A1 | 3/2009 | Leuschner |
| 2009/0185410 A1 | 7/2009 | Huai |
| 2009/0302403 A1 | 12/2009 | Nguyen |
| 2010/0034008 A1 | 2/2010 | Wang |

OTHER PUBLICATIONS

I.L. Prejbeanu et al., Thermally Assisted MRAM, J. Phys. Condens. Matter 19 (2007) 165218.

Y. Zheng et al., Multilevel Magnetic-Resistive Random Access Memory Written at Curie Point, Intermag Europe 2002, BB-02.

Berger, L., Emission of Spin waves by a magnetic multilayer traversed by a current, Physical Review B, Oct. 1, 1996, pp. 9353-9358, vol. 54, No. 13, The American Physical Society, USA.

Florez, S.H. et al., Modification of Critical Spin Torque Current Induced by rf Excitation, Journal of Applied Physics, 103, 07a708 (2008).

Han et al., Current-Induced Butterfly Shaped Domains and Magnetization Switching in Magnetic Tunnel Junctions, Science and Technology of Advanced Materials 6 (2005) 784-788.

Hosomi et al., A Novel Nonvolatile Memory with Spin Torque Transfer Magnetization Switching: Spin-RAM, 2005 IEEE.

Johnson, M.T., et al., Magnetic anisotropy in metallic multilayers, Rep. Prog. Phys., 1996, pp. 1409-1458, vol. 59, IOP Publishing Ltd., UK.

Kawahara et al., 2Mb Spin-Transfer Torque RAM (SPRAM) with Bit-by-bit Bidirectional Current Write and Parallelizing Direction Current Read, ISSC 2007/Session 26/Non-Volatile Memories/26.5.

Kim, Chris H., et al. Dynamic Vt SRAM: A Leakage Tolerant Cache Memory for Low Voltage Microprocessors, ISLPED '02, Aug. 2002, pp. 251-254, US.

Meng et al., Spin Transfer in Nanomagnetic Devices with Perpendicular Anistropy, Applied Physics Letters 88, 172506 (2006).

Ozatay et al., "Sidewall oxide effects on spin-torque- and magnetic-field-induced reversal characteristics of thin-film nanomagnets", Nature Materials, vol. 7, pp. 567-573 (Jul. 2008).

Rivkin, K. et al., Magnetization Reversal in the Anisotropy-Dominated Regine Using Time-Dependent Magnetic Fileds, Applied Physics Letters 89, 252507 (2006).

Seki et al., Spin-Polarized Current-Induced Magnetization Reversal in Perpendicularly Magnetized L1o-FePt Layers, Applied Physics Letters 88, 172504 (2006).

Slonczewski et al., Conductance and Exchange Coupling of Two Ferromagnets Separated by a Tunneling Barrier, 1989 the American Physical Society, Physical Review B, vol. 39, No. 10, Apr. 1, 1989.

Slonczewski et al., Current-Driven Excitation of Magnetic Multilayers, Journal of Magnetism and Magnetic Materials 159 (1996) L1-L7.

Sun, Spin-Current Interaction with Monodomain Magnetic Body: A Model Study, Physical Review B, vol. 62, No. 1, Jul. 2000.

Thiele et al., FeRh//FePt Exchange Spring Films for Thermally Assisted Magnetic Recording Media, Applied Physics Letters, vol. 82, No. 17, Apr. 2003, p. 2859-2861.

Thiele et al., "Magnetic and Structural Properties of FePt-FeRh Exchange Spring Films for Thermally Assisted Magnetic Recording Media", IEEE Trans. Magnetics, vol. 40, Jul. 2004, p. 2537-2542.

Thiele et al., Spin Dynamics of the Anitferromagnetic-to-Ferromagnetic Phase Transition in FeRh on a Sub-Picosecind Time Scale, Applied Physics Letters, vol. 85, No. 14, Oct. 2004, p. 2857-2859.

Yagami, Kojiro, et al., Inspection of Intrinsic Critical Currents for Spin-Transfer Magnetization Switching, IEEE Transactions on Magnetics, Oct. 2005, pp. 2615-2617, vol. 41, No. 10.

Zhang, L., et al., Heat-assisted magnetic probe recording on a granular CoNi/Pt multilayered film, Journal of Physics D: Applied Physics, 2006, pp. 2485-2487, vol. 39, IOP Publishing Ltd., UK.

U.S. Appl. No. 12/106,363, filed Apr. 21, 2008, Inventors: Xi et al.

U.S. Appl. No. 12/125,975, filed May 23, 2008, Inventors: Xi et al.

U.S. Appl. No. 12/239,887, filed Sep. 29, 2008, Inventors: Zheng et al.

U.S. Appl. No. 12/242,254, filed Sep. 30, 2008, Inventors: Zheng et al.

U.S. Appl. No. 12/248,237, filed Oct. 9, 2008, Inventor: Zhu.

U.S. Appl. No. 12/389,422, filed Feb. 20, 2009, Inventors: Ahn et al.

U.S. Appl. No. 12/396,868, filed Mar. 3, 2009; Inventors: Zheng.

U.S. Appl. No. 12/425,457, filed Apr. 17, 2009, Inventors: Gao et al.

U.S. Appl. No. 12/425,466, filed Apr. 17, 2009, Inventors: Lou et al.

Zheng et al., Multistate Per-Cell Magnetoresistive Random-Access Memory Written at Curie Point, IEEE Transactions on Magnetics, vol. 38, No. 5, Sep. 2002.

Zhang et al., Heat-Assisted Magnetic Probe Recording on a Granular CoNi/Pt Multilayered Film, Journal of Physics D: Applied Physics, 39, (2006) 2485-2487.

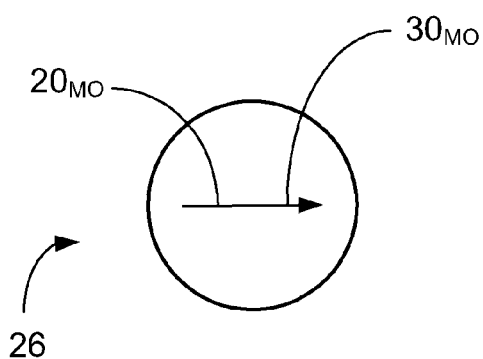
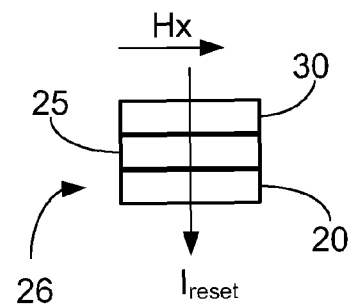
FIG. 3A   FIG. 3B
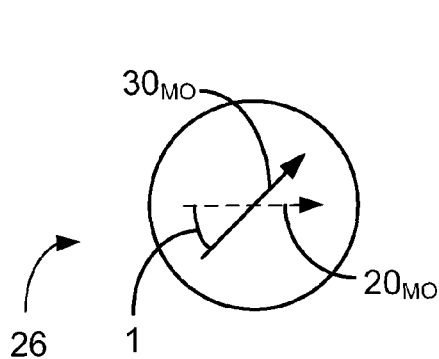
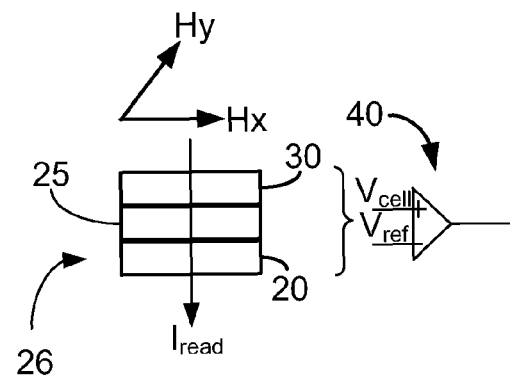
FIG. 4A   FIG. 4B

THERMALLY ASSISTED MULTI-BIT MRAM

CROSS-REFERENCE

This application is a divisional of application Ser. No. 12/242,254, filed Sep. 30, 2008, the contents of each is hereby incorporated by reference in its entirety.

BACKGROUND

Magnetoresistive random access memory (MRAM) devices are solid state, non-volatile memory devices which make use of the giant magnetoresistive effect. A conventional MRAM device includes a column of first electrical wires, referred to as word lines, and a row of second electrical wires, referred to as bit lines. An array of magnetic memory cells, located at the junctions of the word lines and bit lines, is used to record data signals.

A magnetic memory cell includes a hard magnetic layer, a soft magnetic layer, and a non-magnetic layer sandwiched between the hard magnetic layer and the soft magnetic layer. The hard magnetic layer has a magnetization vector or orientation fixed in one direction. The orientation of this magnetization vector does not change under a magnetic field applied thereon. The soft magnetic layer has an alterable magnetization vector or orientation under a magnetic field applied thereon, that either points to the same direction, hereinafter "parallel alignment", or to the opposite direction, hereinafter "antiparallel alignment", of the magnetization vector or orientation of the hard magnetic layer. Since the resistances of the magnetic memory cell in the "parallel alignment" status and the "antiparallel alignment" status are different, the two types of alignment status can be used to record the two logical states—the "0"s or "1"s of a data bit. This can be described as a "dual bit" memory unit.

In a writing operation, an electric current passes through the word line and the bit line adjacent to the memory cell. When the electric current reaches a certain threshold, a magnetic field generated by the electric current will switch the orientation of the magnetization vector of the soft magnetic layer. As a result, the magnetization vector of the hard magnetic layer and the soft magnetic layer will be changed from one type of alignment, e.g. "parallel alignment", to the other type of alignment, e.g. "antiparallel alignment", so that a data signal in form of one data bit can be recorded in the memory cell.

In MRAM structure design, a lower writing power dissipation and a higher cell density are most desired. Unfortunately, a reduction of cell size, i.e. an increase in cell density, will lead to a reduction in the available energy ($K_uV$) to store the bit message. Further, the error rate increases very rapidly as the cell size scales down. However, in order to reduce the error rate, high anisotropy energy is required to overcome thermal fluctuations. Hard magnetic material has higher anisotropy energy compared with soft magnetic material, but in that case a higher writing current is required. The higher anisotropy energy results in higher writing current density, which unfortunately has the disadvantage of electro-migration.

In order to reduce the writing current for a high coercivity MRAM, thermally assisted MRAMs are disclosed. Un-pinned ferromagnetic materials, in which the coercivity decreases sharply as temperature increases, are used for the recording layer in the MRAMs. However, due to variations in the MRAM manufacturing process, the reading margin is reduced. Thus, there is a need for MRAM that provides improved reading margin as the MRAM technology scales down.

BRIEF SUMMARY

The present disclosure relates to thermally assisted multi-bit MRAM. In particular, the present disclosure relates to self-detected writing to a multi-bit (i.e., multilevel) thermally assisted MRAM. The self-detected writing increases a reading margin between data state levels and decreases reading margin variability due to cell resistance variation.

One illustrative method of writing to a multi-bit MRAM memory unit includes setting an MRAM memory cell to a zero state level. The MRAM memory cell includes a recording magnetic layer having a zero state level recording magnetization orientation and a free magnetic layer having a zero state level free magnetization orientation. The recording magnetization orientation is in parallel relation to the free magnetization orientation at the zero state level. Then the method includes passing a read current through the MRAM memory cell to read a voltage across the MRAM memory cell and rotating the free magnetization orientation from the zero state level free magnetization orientation by reading the voltage across the MRAM memory cell until a first desired state voltage is reached to form a first desired state free magnetization orientation forming an first desired state angle with the zero state level recording magnetization orientation. Then the method includes heating the MRAM memory cell recording magnetic layer to a temperature above a block temperature of the recording magnetic layer to alter the recording magnetization orientation to be in parallel relation to the first desired state free magnetization orientation forming a first desired state recording magnetization orientation and cooling the MRAM memory cell to a temperature below the block temperature of the recording magnetic layer to set the recording magnetization orientation at the first desired state recording magnetization orientation.

BRIEF DESCRIPTION OF THE DRAWINGS

The disclosure may be more completely understood in consideration of the following detailed description of various embodiments of the disclosure in connection with the accompanying drawings, in which:

FIG. 3A is a schematic diagram top view of the exemplary memory stack having a resetting magnetic field and/or current applied;

FIG. 3B is a schematic side view of the exemplary memory stack illustrated in FIG. 3A;

FIG. 4A is a schematic diagram top view of rotating a magnetization orientation of the exemplary memory stack;

FIG. 4B is a schematic side view of the exemplary memory stack illustrated in FIG. 4A;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to thermally assisted multi-bit MRAM. In particular, the present disclosure relates to self-detected writing to a multi-bit (i.e., multilevel) thermally assisted MRAM. The self-detected writing increases a reading margin between data state levels and decreases reading margin variability due to cell resistance variation. While the present disclosure is not so limited, an appreciation of various aspects of the disclosure will be gained through a discussion of the examples provided below.

Figure 1:
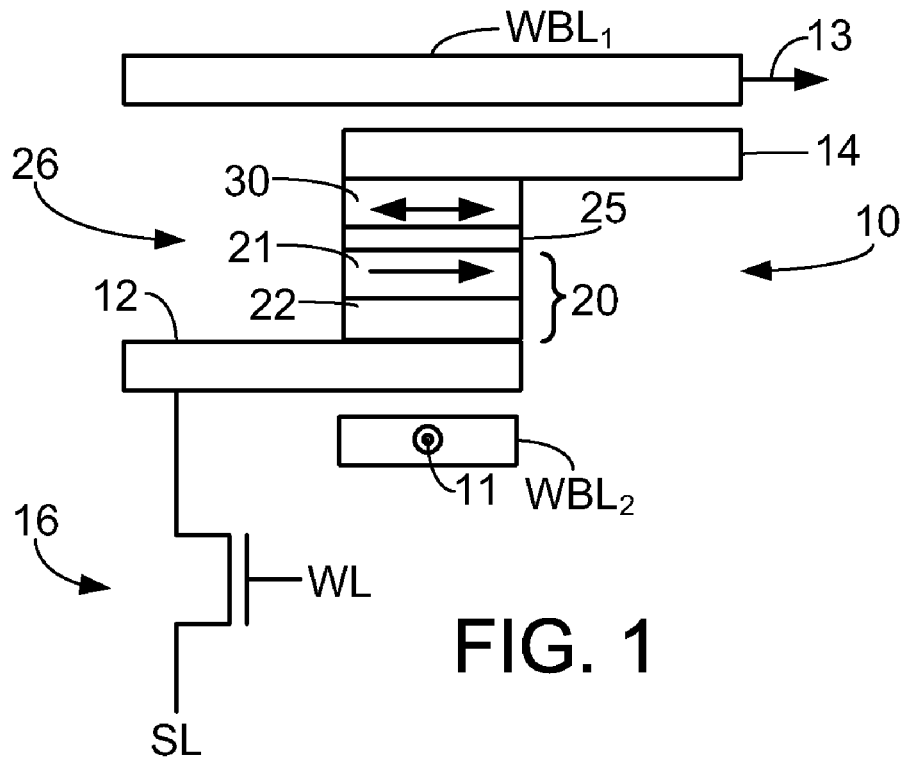
FIG. 1 is a schematic side view of an exemplary MRAM memory unit.

FIG. 1 is a schematic side view of an exemplary MRAM memory unit 10. The MRAM memory cell 10 includes a recording magnetic layer 20, a free magnetic layer 30 and a tunneling barrier 25 separating the recording magnetic layer 20 from the free magnetic layer 30. These layers are disposed electrically between a first electrode 12 and a second electrode 14 forming a memory stack 26. An access transistor 16 is electrically connected to the first electrode 12. The access transistor 16 can be electrically coupled to a source line SL and a word line WL, for example. While a single MRAM memory unit 10 is shown, it is understood that a plurality of MRAM memory units 10 can be arranged in an array to form a memory array.

A first writing bit line $WBL_1$ is electrically isolated from the memory stack 26 and passes close enough to the memory stack 26 so that its magnetic field generated by a current 13 passing thought the first writing bit line $WBL_1$ can alter the magnetization orientations of the recording magnetic layer 20 and/or the free magnetic layer 30. The first writing bit line $WBL_1$ longitudinally extends in a first direction.

A second writing bit line $WBL_2$ is electrically isolated from the memory stack 26 and passes close enough to the memory stack 26 so that its magnetic field generated by a current 11 passing thought the second writing bit line $WBL_2$ can alter the magnetization orientations of the recording magnetic layer 20 and the free magnetic layer 30. The second writing bit line $WBL_2$ longitudinally extends in a second direction and in many embodiments is orthogonal to the first direction.

The recording magnetic layer 20 includes, at least, a ferromagnetic layer 21 and an antiferromagnetic layer 22. The antiferromagnetic layer 22 serves to fix the magnetization of the ferromagnetic layer 21. The recording magnetic layer 20 has a blocking temperature (i.e., critical temperature) that is substantially the Curie temperature. The blocking temperature of the antiferromagnetic layer 22 is the temperature at or above which the antiferromagnetic layer 22 loses its ability to pin (i.e., fix) the magnetization orientation of the adjacent ferromagnetic layer 21. In many embodiments, the blocking temperature is in a range from 100 to 350 degrees centigrade. In some embodiments, the recording magnetic layer 20 includes more than one ferromagnetic layer that are coupled anti-ferromagnetically to each other (e.g., synthetic antiferromagnet). The synthetic antiferromagnet structure of recording magnetic layer 20 can reduce stray magnetic field interactions with the free magnetic layer 30. The ferromagnetic layer 21 can be formed of any useful material such as, for example, alloys and materials including Co, Fe, and/or Ni. The antiferromagnetic layer 22 can be formed of any useful material such as, for example, IrMn, FeMn, and/or PtMn.

The free magnetic layer 30 includes, at least, a one ferromagnetic layer 30. In some embodiments, the free magnetic layer 30 includes more than one ferromagnetic layer that are coupled anti-ferromagnetically to each other. The synthetic antiferromagnet structure of free magnetic layer 30 can reduce stray magnetic field interactions with the recording magnetic layer 20. The ferromagnetic layer 30 can be formed of any useful material such as, for example, alloys and materials including Co, Fe, and/or Ni. The free layer 30 has a magnetization orientation that is alterable or rotatable upon application of an external magnetic field (such as is produced by the first writing bit line $WBL_1$ and the second writing bit line $WBL_2$).

The tunneling barrier 25 separates the free magnetic layer 30 from the recording magnetic layer 20. The tunneling barrier 25 is an electrically insulating and non-magnetic material. The tunneling barrier 25 can be formed of any useful material such as, for example, AlO, MgO, and/or TiO.

The access transistor 16 can be any useful transistor such as, for example, a NMOS or PMOS device. The access transistor 16 can provide both a reading current and a heating current to the recording magnetic layer 20 and the free magnetic layer 30.

Figure 2:
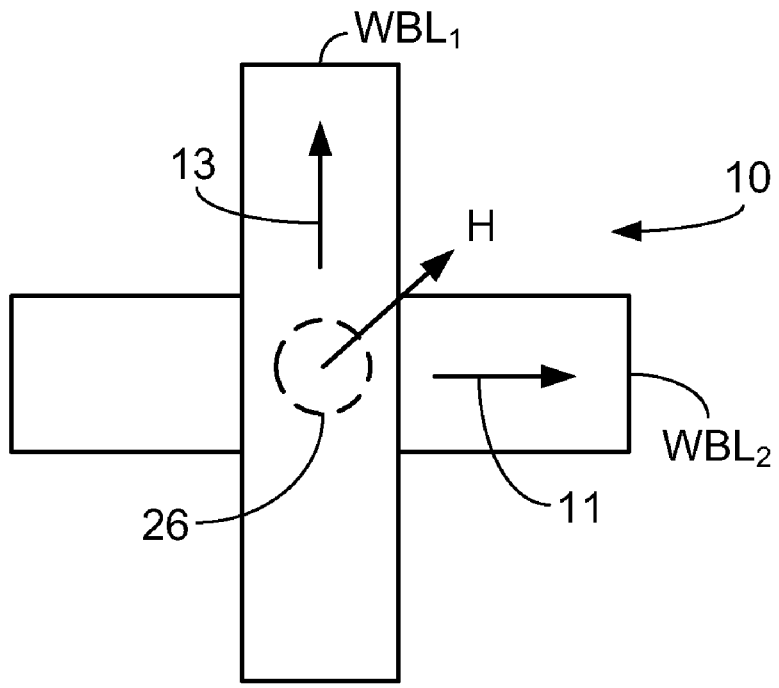
FIG. 2 is a schematic diagram top view of the exemplary MRAM memory unit illustrated in FIG. 1.

FIG. 2 is a schematic diagram top view of the exemplary MRAM memory unit 10 illustrated in FIG. 1. The first writing bit line $WBL_1$ and the second writing bit line $WBL_2$ are illustrated orthogonal to each other, however other relative orientations of the first writing bit line $WBL_1$ and the second writing bit line $WBL_2$ are possible, as desired. The memory stack 26 circular profile is shown in phantom since the first writing bit line $WBL_1$ is illustrated covering the memory stack 26. A magnetic filed H is formed as a function of the relative magnetic field of the first writing bit line $WBL_1$ (formed as a function of the current 13) and the second writing bit line $WBL_2$ (formed as a function of the current 11).

In the present disclosure a self-detected writing method is described. FIG. 3A-6B illustrate steps to perform the self-detected writing method. The memory cell 26 for these figures is described above and includes recording magnetic layer 20, a free magnetic layer 30 and a tunneling barrier 25 separating the recording magnetic layer 20 from the free magnetic layer 30.

A reference voltage is selected using the reference resistance which is adjacent to the chip block to minimize the effect from temperature and pattern process. For example the reference voltage is Vref. According to the $VL_{max}$ and $VH_{min}$ where the voltage value range between $VL_{max}$ and $VH_{min}$ is the reading margin (see FIG. 7, reference number 100), and set $(\Delta V <= (VH_{min} - VL_{max})/2^N)$ $(\Delta V < (VH_{min} - VL_{max})/(2^N - 2))$ for $2^N$ level, $N >= 2$. Here, the level number is assumed to be $2^N$, however any other level number can also be used. The $VL_{max}$ is the upper margin of the voltage of the low resistance state. And the $VH_{min}$ is the lower margin of the voltage of the high resistance. In order to write the ith state, the voltage is set to be $Vref = VL_{max} + \Delta V^* i$, $i = 0 - 2^N - 1$, $(Vref - \Delta V^*(2^{(N-1)} - 1 + i))$ $i >= 1$. One illustrate writing sequence is described as follows.

FIG. 3A is a schematic diagram top view of the exemplary memory stack 26 having a resetting magnetic field and/or current applied and FIG. 3B is a schematic side view of the exemplary memory stack illustrated in FIG. 3A. A resetting external magnetic field Hx (provided by one of the writing bit lines) and/or resetting current $I_{reset}$ is applied to the memory stack 26 to place the memory stack 26 in a low resistance state or zero state level. Setting the memory stack 26 to the zero state level places the recording magnetic layer magnetization orientation $20_{MO}$ and the free magnetic layer magnetization orientation $30_{MO}$ in parallel relation (both pointing in the same direction). A reading current can be applied through the memory stack 26 in a low resistance state or zero state level and the reference voltage can be set for the desired state level as described above.

FIG. 4A is a schematic diagram top view of rotating a magnetization orientation of the exemplary memory stack 26 and FIG. 4B is a schematic side view of the exemplary memory stack illustrated in FIG. 4A. The free magnetic layer 30 magnetization orientation $30_{MO}$ rotates from parallel relation with the recording layer 20 magnetization orientation $20_{MO}$ to a first desired state free magnetization orientation $30_{MO}$ forming an first desired state angle 1 with the zero state level recording magnetization orientation $20_{MO}$. The free magnetic layer 30 magnetization orientation $30_{MO}$ rotates due to applying a first desired state magnetic field (Hy and Hx formed by the writing bit lines, described above). A reading current $I_{read}$ is passed through the memory stack 26 and a memory cell voltage $V_{CELL}$ is compared (using a comparator 40) to the desired state reference voltage $V_{REF}$. Once the memory cell voltage $V_{CELL}$ equals the desired state reference voltage $V_{REF}$ the rotation of the free magnetic layer 30 magnetization orientation $30_{MO}$ ceases and is determined to have reached the first desired state free magnetization orientation $30_{MO}$. While the first desired state is described here, it is understood that the same procedure can be followed for any of the desired states.

Figure 5A:
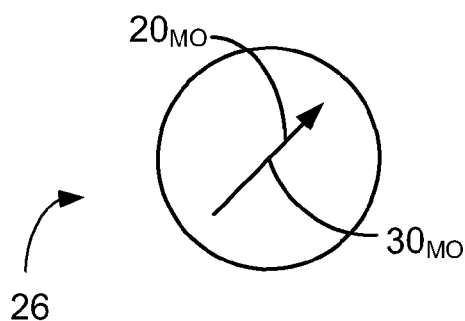
FIG. 5A is a schematic diagram top view of applying a setting current to the exemplary memory stack.
Figure 5B:
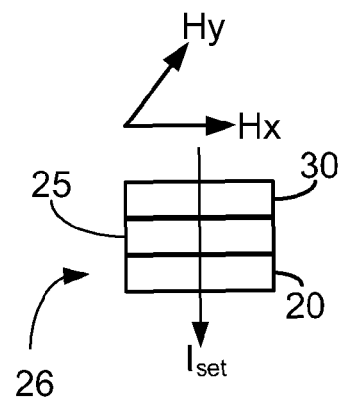
FIG. 5B is a schematic side view of the exemplary memory stack illustrated in FIG. 5A.

FIG. 5A is a schematic diagram top view of applying a setting current to the exemplary memory stack 26 and FIG. 5B is a schematic side view of the exemplary memory stack 26 illustrated in FIG. 5A. While maintaining the first desired state magnetic field (Hy and Hx) a setting current passes through the memory stack 26 to heat the layers of the memory cell to a temperature at or above the blocking temperature of the recording layer 20. This allows the recording layer 20 magnetization orientation $20_{MO}$ to rotate from zero state level to the first desired state recording magnetization orientation $20_{MO}$ and be in parallel relation with the free magnetic layer 30 first desired state free magnetization orientation $30_{MO}$. Then the setting current $I_{set}$ is removed from the memory stack 26 and the memory stack 26 is allowed to cool below the blocking temperature of the recording layer 20 and pin to recording layer 20 magnetization orientation $20_{MO}$ at the first desired state recording magnetization orientation.

Figure 6A:
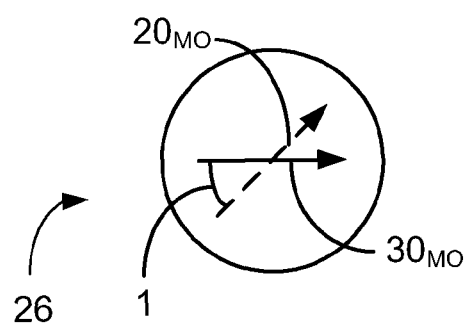
FIG. 6A is a schematic diagram top view of removing the setting magnetic field from the exemplary memory stack.
Figure 6B:
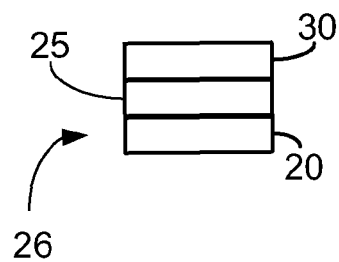
FIG. 6B is a schematic side view of the exemplary memory stack illustrated in FIG. 6A.

FIG. 6A is a schematic diagram top view of removing the setting magnetic field from the exemplary memory stack 26 and FIG. 6B is a schematic side view of the exemplary memory stack illustrated in FIG. 6A. The first desired state magnetic field (Hy and Hx) is removed from the memory stack 26 and the free magnetic layer 30 magnetization orientation $30_{MO}$ can rotate from the first desired state free magnetization orientation to the zero state level recording magnetization orientation upon application of an external magnetic field forming the first desired state angle 1 with the first state level recording magnetization orientation $20_{MO}$.

One detecting method is a parallel detecting scheme, which is fast, but need many comparators. The other detecting scheme is a serial detecting scheme, where only one comparator is required, but its reading rate is lower compared to the parallel detecting scheme. In the parallel detecting scheme, the reference voltage are set to be $Vref1 = VL_{max} + \Delta V^*(i - \frac{1}{2})$, $i = 1$ to $2^N$, $Vref - \Delta V^*(2^{(N-1)} - 1 + i)$, $i >= 1$ to $2^N - 1$, which is same as that in the writing case. By processing the output, the desired level can be detected. In the serial detecting scheme, every time, the voltage is set to $Vset = VL_{max} + \Delta V^*(i - \frac{1}{2})$, $i = 1$ to $2^N$, $Vref - \Delta V(2^{(N-1)} - 1 + i)$, $i >= 1$, then compare the Vcell with Vset, if $Vcell < (or >) Vset$, and increase the level voltage (increase i) and continue to compare it until $Vcell > (or) Vset$. It is understood that other detecting schemes can be utilized also. For example, a desired sense voltage can be applied and the current or resistance can be detected until the desired level is achieved.

Figure 7:
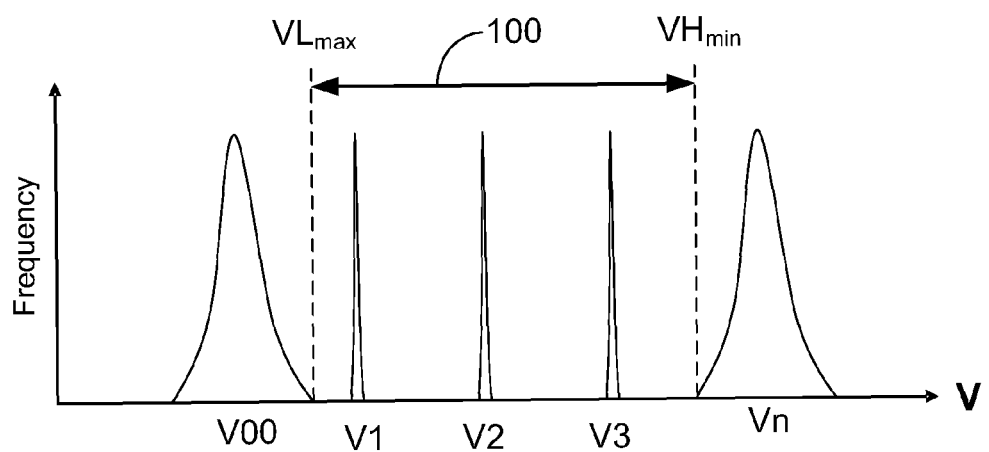
FIG. 7 is a graph of the voltage distribution of the exemplary memory stack at various resistance states.

Using the self-detected writing described herein, the reading voltage distribution is only dependent on the comparator's performance and the margin between the highest and lowest level. FIG. 7 is a graph of the voltage distribution of the exemplary memory stack at various resistance states. As the comparator has much narrow distribution, the reading margin can be improved significantly in the present scheme. Five voltage levels V00, V1, V2, V3 and Vn are shown in FIG. 7. Where the self-detected voltage levels V1, V2, and V3 illustrate a very narrow voltage distribution as compared to V00 or Vn. The voltage distribution V00 is a broad voltage distribution for the zero or low resistance state of all the memory cells in an array and Vn is the voltage distribution for the highest resistance state of all the memory cells in an array. The voltage range between the maximum low resistance state voltage $VL_{max}$ and the minimum high resistance state voltage $VH_{min}$ is the reading margin 100 for the memory cells. The voltage distribution of V1, V2, and V3 are each very narrow when compared to V00 or Vn. The voltage distribution V1, V2, and V3 can be attributed to the detection circuit. Thus, two or three or four or more self-detected voltage levels can be written to the memory cell within the reading margin 100. In addition the same voltage is used for both the writing and the reading operation which provides a large reading margin. As the reading margin increases, the number of voltage levels can also be increased. An alternative detection scheme includes providing a sense voltage and then detecting the current or resistance can be detected until the desired level is achieved.

Thus, embodiments of the THERMALLY ASSISTED MULTI-BIT MRAM are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method of writing to a MRAM memory unit comprising:
    setting an MRAM memory cell to a zero state level, the MRAM memory cell comprising a recording magnetic layer and a free magnetic layer;
    passing a read current through the MRAM memory cell to read a zero state voltage across the MRAM memory cell;
    rotating the free magnetization orientation from a zero state level free magnetization orientation until a first desired state voltage is reached to form a first desired state free magnetization orientation forming a first desired state angle with the zero state level recording magnetization orientation;
    heating the MRAM memory cell recording magnetic layer to a temperature above a blocking temperature of the recording magnetic layer to rotate the recording magnetization orientation to parallel relation with the first desired state free magnetization orientation forming a first desired state recording magnetization orientation; and
    cooling the MRAM memory cell to a temperature below the blocking temperature of the recording magnetic layer to set the recording magnetization orientation at the first desired state recording magnetization orientation.

2. A method according to claim 1, wherein the rotating step comprises applying a first desired state magnetic field to the MRAM memory cell to rotate the free magnetization orientation to a first desired state free magnetization orientation that forms a first desired angle with the zero state level recording magnetization orientation.

3. A method according to claim 2, further comprising removing the first desired state magnetic field from the MRAM memory cell to form the first desired state angle between the zero state level free magnetization orientation and the first desired state recording magnetization orientation.

4. A method according to claim 2, wherein the applying step comprises applying a first desired state magnetic field to the MRAM memory cell a first writing bit line and a second writing bit line, the first writing bit line and the second writing bit line at electrically isolated from the recording magnetic layer, wherein the first writing bit line and the second writing bit line are orthogonal to each other and the heating step comprises passing a current through the MRAM memory cell.

5. A method according to claim 4, wherein the first writing bit line provides a first magnetic field and the second writing bit line provides a second magnetic field and the first magnetic field and the second magnetic field form the first desired state magnetic field.

6. A method according to claim 1, wherein the MRAM memory cell comprises a free magnetic layer and a recording magnetic layer separated by a tunneling barrier.

7. A method according to claim 6, wherein the tunneling barrier comprises an electrical insulating oxide material.

8. A method according to claim 6, wherein the free magnetic layer and a recording magnetic layer have a circular cross-sectional profile.

9. A method according to claim 1, wherein the MRAM memory cell records four or more desired states.

10. A method according to claim 1, further comprising comparing the voltage across the MRAM memory cell to the first desired state voltage with a comparator.

11. A method of writing to a MRAM memory unit comprising:
    setting an MRAM memory cell to a zero state level, the MRAM memory cell comprising a recording magnetic layer, and the free magnetic layer and a recording magnetic layer have a circular cross-sectional profile;
    passing a read current through the MRAM memory cell to read a zero state voltage across the MRAM memory cell;
    applying a first desired state magnetic field to the MRAM memory cell to rotate a free magnetic layer magnetization orientation until a first desired state voltage is reached;
    heating the MRAM memory cell recording magnetic layer to a temperature above a blocking temperature of the recording magnetic layer;
    cooling the MRAM memory cell to a temperature below the blocking temperature of the recording magnetic layer to set the recording magnetization orientation at a first desired state recording magnetization orientation; and
    removing the first desired state magnetic field from the MRAM memory cell to form the first desired angle between the zero state level free magnetization orientation and the first desired state recording magnetization orientation.

12. A method according to claim 11, wherein the applying step comprises applying a first desired state magnetic field to the MRAM memory cell a first writing bit line and a second writing bit line, the first writing bit line and the second writing bit line at electrically isolated from the recording magnetic layer, wherein the first writing bit line and the second writing bit line are orthogonal to each other.

13. A method according to claim 12, wherein the first writing bit line provides a first magnetic field and the second writing bit line provides a second magnetic field and the first magnetic field and the second magnetic field form the first desired state magnetic field.

14. A method according to claim 11, wherein the MRAM memory cell comprises a free magnetic layer and a recording magnetic layer separated by a tunneling barrier.

15. A method according to claim 14, wherein the tunneling barrier comprises an electrical insulating oxide material.

16. A method according to claim 14, wherein the heating step comprises passing a current through the MRAM memory cell.

17. A method according to claim 11, wherein the MRAM memory cell records four or more desired states.

18. A method of writing to a memory unit comprising:
    setting an MRAM memory cell to a zero state level, the MRAM memory cell comprising a un-pinned recording magnetic layer having a zero state level recording magnetization orientation and a free magnetic layer having a zero state level free magnetization orientation, and the free magnetic layer and a recording magnetic layer have a circular cross-sectional profile;
    applying a read voltage across the MRAM memory cell to read a zero state current passing through the MRAM memory cell;

applying a first desired state magnetic field to the MRAM memory cell to rotate the free magnetization orientation;

rotating the free magnetization orientation from the zero state level free magnetization orientation until a first desired state current is reached to form a first desired state free magnetization orientation forming an first desired state angle with the zero state level recording magnetization orientation;

heating the MRAM memory cell recording magnetic layer to a temperature above a blocking temperature of the recording magnetic layer to alter the recording magnetization orientation to be in parallel relation to the first desired state free magnetization orientation forming a first desired state recording magnetization orientation;

cooling the MRAM memory cell to a temperature below the blocking temperature of the recording magnetic layer to set the recording magnetization orientation at the first desired state recording magnetization orientation; and removing the first desired state magnetic field from the MRAM memory cell to form the first desired angle between the zero state level free magnetization orientation and the first desired state recording magnetization orientation.

19. A method according to claim 18, wherein the MRAM memory cell comprises a free magnetic layer and a recording magnetic layer separated by a tunneling barrier.

20. A method according to claim 19, wherein the tunneling barrier comprises an electrical insulating oxide material.

\* \* \* \* \*